United States Patent [19]

Konecke et al.

[11] Patent Number: 5,372,296
[45] Date of Patent: Dec. 13, 1994

[54] GRAPHITE LID SEAL FIXTURE

[75] Inventors: Sheila J. Konecke, Leesburg; Frederick G. Weindelmayer, Manassas, both of Va.

[73] Assignee: International Business Machines Corporation, Armonk, N.Y.

[21] Appl. No.: 142,029

[22] Filed: Oct. 28, 1993

[51] Int. Cl.⁵ .................................... B32B 3/00
[52] U.S. Cl. ................. 228/124.6; 228/49.1; 228/212
[58] Field of Search ............ 228/6.2, 49.1, 122, 228/121, 212, 124.6; 437/215, 217, 218

[56] References Cited

U.S. PATENT DOCUMENTS 3,436,201  4/1969  Tsuji et al. .............. 437/216 X
3,768,991  10/1973  Rogers .................... 437/218 X
4,804,130  2/1989  Kwan et al. .............. 228/6.2

OTHER PUBLICATIONS

Hitachi, Ltd., Hermetic Sealing Process With Atmospheric Pressure Vibration for LSI Packages, 1991, IEEE.

Primary Examiner—Kenneth J. Ramsey
Attorney, Agent, or Firm—Lauren C. Bruzzone; Lawrence R. Fraley

[57] ABSTRACT

In manufacturing packaged modules for computer systems, many modules require sealing a lid to a lower substrate by using solder around the outer edges of the lower substrate. When the solder is heated, it often flows inward towards the chips on the substrates (solder intrusions) and may cause shorts. This invention solves the problem of solder intrusions by using a graphite lid seal fixture during lid seal. The fixture is comprised of lower and upper parts. The substrate, which has a sealband area, rests on and is held in place by the lower part of the fixture. The upper part of the fixture rests on the lower part. The lid, which has solder on its lower surface which is slightly smaller but otherwise generally matches the sealband area of the substrate, fits in a hole in the upper part and rests on the substrate. Thus, graphite substantially surrounds the edges where the lid and substrate meet and the fixture evenly distributes the heat around the sealband during reflow so that the solder can flow out towards the edge of the sealband. By this means, areas where solder flows back into the interior of the module are reduced and hermeticity yields are improved.

9 Claims, 4 Drawing Sheets

GRAPHITE LID SEAL FIXTURE

FIELD OF INVENTION

The present invention is broadly related to the field of packaging computer chips. More particularly, it is related to an improved method of solder sealing a lid to a substrate.

BACKGROUND

A critical element of today's faster, more powerful computers is the silicon semiconductor chip which provides the computer its logic or processing power. Commonly, a number of chips are mounted together on a ceramic or silicon substrate. In this form, they are referred to as modules.

The fabrication of a computer chip is a complex operation requiring skill in both the chip design and chip manufacture. This is no less true for the module. On a very simplistic level, the manufacture of the module is as follows. Once the single chips are diced from wafers, they are soldered (using solder bumps or "C4s") to metal pads on a silicon substrate. The silicon substrate is joined to a ceramic carrier with an adhesive. (The silicon substrate and ceramic carrier will together be referred to as the substrate.) Wire bonds made of fine wire are bonded between the aluminum contact pads on the chips and gold plated pads on the substrate that make contact with external pins (or leads). A cover or lid is then sealed over the chips to the surface of the substrate. FIG. 1 illustrates a specific module, namely a VCOS module, prior to lid sealing. As can be seen from this figure, the wire bonds (4) connect to gold leads (6) which are held in place by a lead frame (8) during the sealing operation in which the cover or lid (14) is sealed into place. The lid 14 is shown twice in FIG. 1, in both inverted and upright orientations, for illustration (e.g., of solder placement) purposes.

Due to the large number of steps in the process and the difficulty of each process step, only a fraction will be fully functional. The yield of a process is the fraction of modules fabricated that do not contain flaws. Higher yields are desirable: as the yield improves, more useful modules are produced from a given amount of resources and profits increase.

One of the more sensitive steps in the process of module packaging—and one which can have significant impact on yield—is the step of sealing the lid over the substrate. One method used in this sealing is to create a sealband (10) on the upper surface of the substrate (12). (The term "upper surface" is used to refer to that surface of the substrate to which the chips are attached). The sealband is formed by impregnating the ceramic surface of the substrate with metal and electroplating a metal band (generally a layer of nickel followed by a layer of gold to prevent oxidation) on top of the impregnated area. As is illustrated in the figure, the sealband (10) is formed outside of the device area, that is, it does not contact the chips (1) or the wire bonds (4).

A solder preform (16) is then joined with flux to the lower surface of the lid in a similar profile to the sealband. That is, the solder is formed on the lid to form a pattern which is slightly smaller but otherwise generally matches the sealband area. (The "lower surface" of the lid refers to the surface which will be jointed to the substrate.) The lid is set into place on the substrate so that the sealband and lid with its solder attached are in contact. The entire package (lid, solder, and substrate with sealband) is heated. This causes the solder to melt and join the lid to the substrate. FIG. 2 is a schematic representation of a module with a substrate (2) and a lid (14) held together by solder. In the module illustrated, the substrate sealband is larger than the lid and much of the solder seal is visible (FIGS. 2, 19).

During the sealing process, as the solder is heated, it melts and becomes liquidus, spreading over a larger surface. If the solder spreads into the module, the result is referred to as a solder intrusion.

Solder intrusions are a familiar occurrence, although their exact cause can be difficult to determine. It has been suggested that some intrusions are caused by a pressure differential between the inside and the outside of the package. As the module cools after reflow, the temperature inside the module drops, causing a drop in pressure, which causes the solder to be sucked into the module.

Solder intrusions can cause a number of problems that can significantly impact the yield of a packaging process. First, the solder intrusions are connected to the grounded metal sealband (where the solder was originally placed). If the intrusion bridges between a wire bond area and the sealband, the intrusion can cause a short which will cause the package to fail testing.

The solder intrusions can also cause fine pinholes to form within the seal between the lid and the substrate. This will cause a less than gas-tight seal and the package must be reworked. (The measure of the number of packages which have acceptable seals is referred to as the hermeticity yield).

Finally, for those modules where the substrate sealband is larger than the lid (as illustrated in FIGS. 2, 19), poor flow to the outside of the module can cause an uneven spread of solder over the visible edge of the band. The unevenness cause concern in any visual inspection of the module, resulting a re-X-ray of the module to ensure that the seal was tight.

Solder intrusions have long been a known problem, however, in many types of processes they do not occur with any degree of frequency. It is known, however, that large modules with relatively large sealbands can experience significant solder intrusions. As a result, in VLSI technology, solder intrusions can present a significant problem.

Several techniques were used in the prior art to reduce intrusions.

One such technique was to regulate the temperature of the sealing process. This technique was based on the fact that large intrusions occurred if the temperature during lid seal rose above a specific peak. Thus, at high temperatures, extremely large yield losses on the order of 30% occurred. More specifically, approximately 30 out of each 100 modules would fail functional testing due to solder intrusions bridging to the wire bond pads. In addition, another one to 5 percent of the modules would fail the hermeticity test. Conversely, keeping the peak temperature below 285° C. reduced intrusions and improved overall yields.

Unfortunately, the use of cooler temperatures did not provide a total solution. Intrusions were decreased in the quantity and size but were not eliminated: between 2 and 5 percent of the modules still experienced intrusion problems. In addition, if a temperature below 285° C. was used, the solder did not flow well, causing hermeticity losses of one to two percent. Further, the solder flow to the outside edge was often uneven, resulting in the modules being submitted to additional testing or simply being rejected out of hand.

Another technique to reduce solder intrusions involved sealing the modules in a pressure vessel. Then, during the heating and cooling of the sealing process, the ambient pressure was periodically changed in order to prevent pressure differentials. This solution was expensive, in that it called for additional equipment (the pressure vessel) and additional process steps (namely, a continual monitoring and altering of the pressure). Further, unless the pressure was constantly monitored and altered so that the pressure inside and outside the module was kept approximately equal, solder intrusions would still form.

Still another means of dealing with the solder intrusion problem involves module design. Designs with more chips in the module generally experience fewer intrusions. Modules designed with no metallurgy close to the edges of the sealband experienced solder intrusions but will experience fewer shorts since many of the solder intrusions will not extend to the wire bonds.

Solving the problem with the module design is not, however, always feasible. Modules with a significant amount of complex function may not be able to give up use of the space adjoining the sealband: packaging chips in less space allows more functionality on a card.

OBJECTS OF THE INVENTION

Accordingly, it is an object of the invention to provide an improved method of sealing modules.

It is a further object of the invention to provide a method of sealing modules which eliminates solder intrusions.

It is still a further object of the invention to provide a method which eliminates solder intrusions without requiring difficult or costly design changes to the module layouts themselves and allow for further reduction in spacing.

It is still a further object of the invention to provide a method of eliminating solder intrusions which can be used with existing processes and equipment, thus increasing the yield of current processes with minimal additional cost.

SUMMARY OF THE INVENTION

The invention disclosed herein is a method and apparatus for solder sealing modules in a manner as to eliminate solder intrusions along the interior edge of the module. The sealing operation (whereby a lid and substrate are sealed together to form the module) uses a graphite lid seal fixture. The fixture is comprised of a lower and upper part. The substrate, which has a sealband area, rests on and is held in place by the lower part of the fixture. The upper part of the fixture rests on the lower part. The lid, which has solder on its lower surface which is slightly smaller but otherwise generally matches the sealband area of the substrate, fits in a hole in the upper part and rests on the substrate. Thus, graphite substantially surrounds the edges where the lid and substrate meet. Both the fixture and module are heated, melting the solder and sealing the module. The result is a seal which is substantially free of solder intrusions. The fixture is also useful in aligning the lid and the substrate.

It is known that, as the temperature drops in the interior of the module during cooling, the pressure also drops, causing a vacuum-like effect that pulls the liquidus solder into the interior of the module. The graphite fixture changes the cooling and pressure rates and temperature distribution and thus solder material characteristics such as surface tension, viscosity, and physical state. The probably accounts for the differences with and without the graphite fixture. Soldering has complex metallurgical properties and interactions.

BRIEF DESCRIPTION OF THE FIGURES

The objects, features and advantages of the invention will be better understood with reference to the following drawings.

DETAILED DESCRIPTION OF THE INVENTION

The current implementation of the invention was used in the creation of VCOS (VLSI Chip on Silicon) modules. VCOS modules are multi chip modules (MCM) that are hermetically sealed using tin/antimony (Sn/Sb) solder and an electroplated nickel and gold sealband. The lid seal area (or sealband) has a relatively large total area of approximately 3.06 in. square. VCOS modules generally experienced significant solder intrusion problems in fabrication.

Practical elimination of all solder intrusions was accomplished on the VCOS module by using a graphite lid seal fixture during the lid seal process. The fixture evenly distributes the heat around the sealband during the reflow process (i.e. the heating and cooling during the sealing process) and results in an even flow of solder outward, towards the exterior edges of the sealband. Areas where solder does not flow out around the edge of the sealband are reduced and hermeticity yields are improved. A more detailed description of the graphite lid seal fixture follows.

Figure 1:
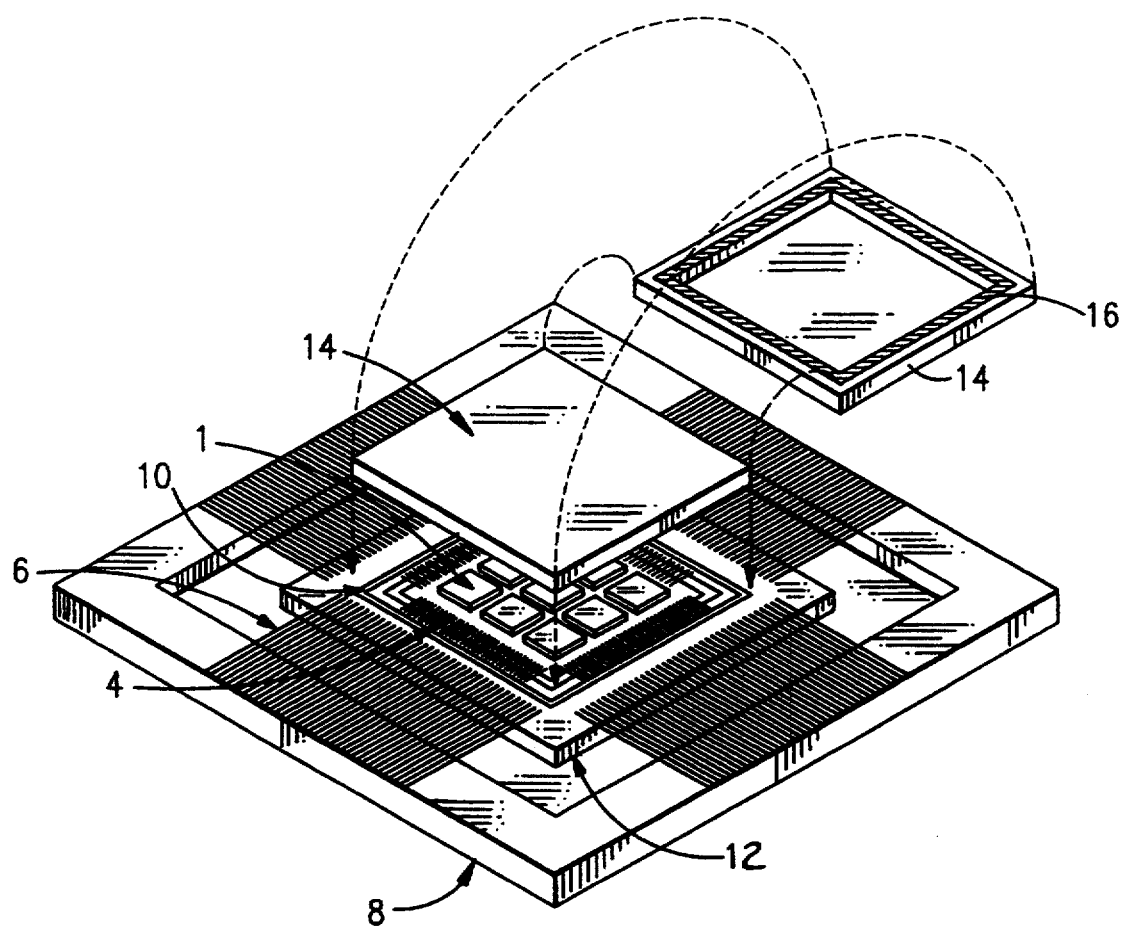
FIG. 1 is a three dimensional view of a lid and substrate prior to sealing.
Figure 2:
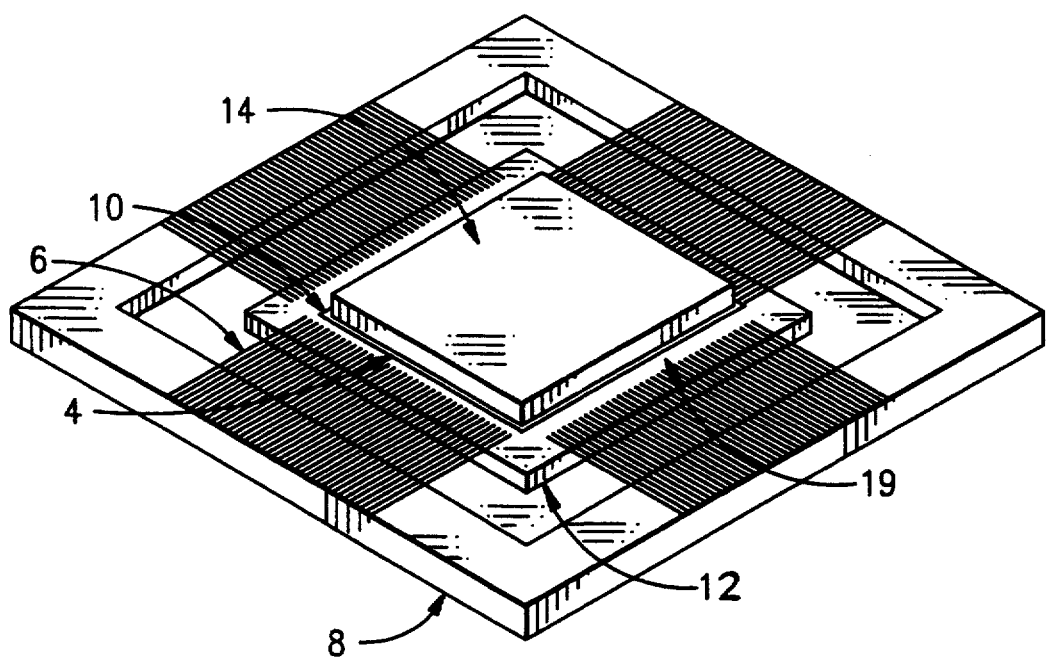
FIG. 2 is a three dimensional view of a sealed lid and substrate.
Figure 3A:
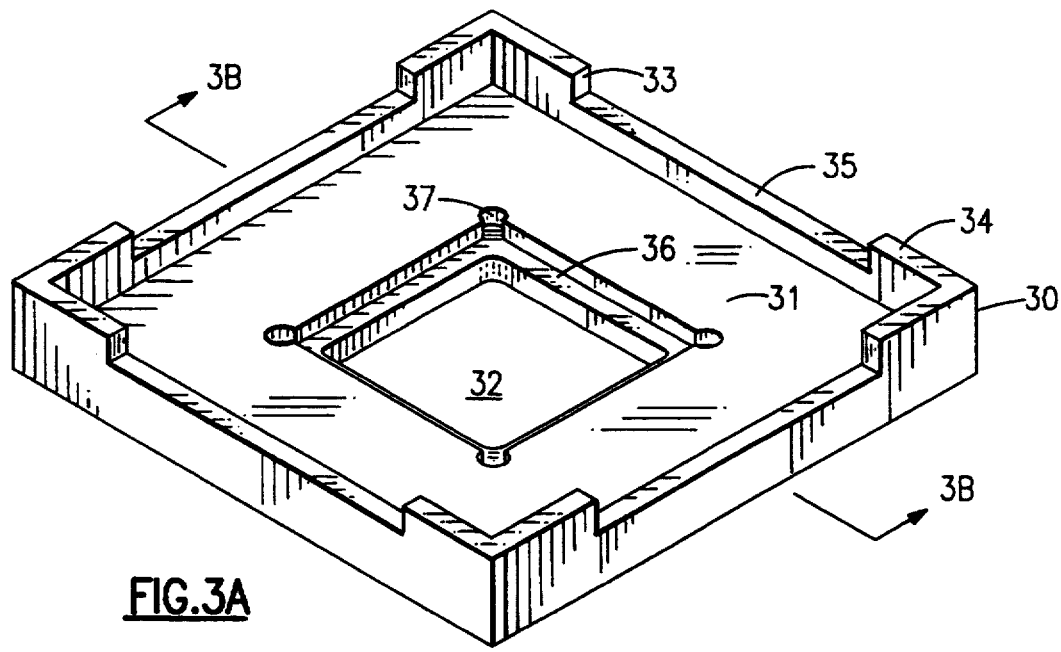
FIG. 3A is a three dimensional view of the lower piece of the graphite lid seal fixture.

The graphite lid seal fixture is comprised of two pieces machined from graphite. Referring to FIG. 3A, it will be seen that the current embodiment of the fixture has a first, lower piece (30) which is substantially rectangular in shape with a substantially rectangular hole (32) in its center. The current embodiment of the lower piece has two further features. First, the lower piece has a rim (33) around its outer edge. A section of the rim at each of the corners is higher than the rim along the sides (35) forming reverse notches at the corners (34). Secondly, the upper surface of the lower piece of the fixture (the floor of the fixture (31)) has an indentation around the edges of the hole forming a ledge (36). In the current embodiment, the ledge has circular depressions on each of its corners (37) for ease of machining.

Figure 3B:
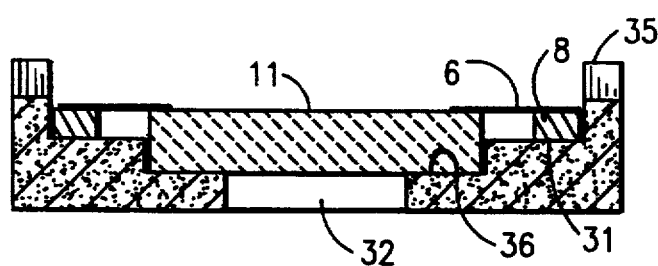
FIG. 3B is a cross-section of the lower piece of the graphite lid seal fixture, as taken along the line 3B—3B in FIG. 3A.

During the sealing operation, the bottom of the substrate rests on the lower piece of the fixture. FIG. 3B is a cross section of the lower piece taken along the line 3B—3B with the substrate in place. As can be seen from this figure, the outer edges of the substrate (11) rest on the ledge (36), with the bottom of the substrate over the hole (32). The leads (6) and lead frame (8) lie on the floor of the fixture (31), within the rim (33).

Figure 3C:
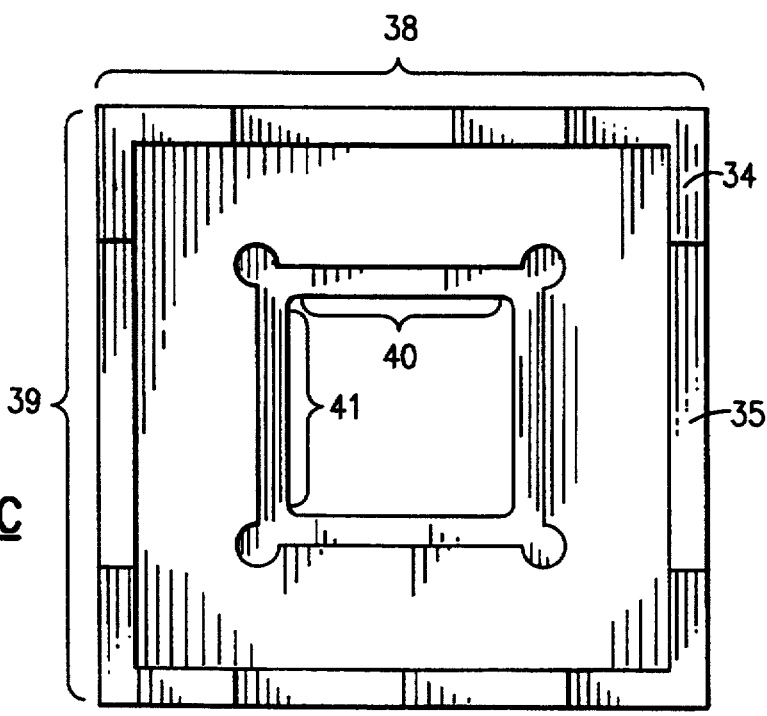
FIG. 3C is a top-view of the lower piece of the graphite lid seal fixture.

Referring to FIG. 3C, the width (38) and length (39) of the area of the lower piece within the rim are chosen so that the substrate, leads and lead frame fit securely inside the rim (33). The fit is secure, but not snug. The substrate and lead frame should be held so that the movement in the x-y direction is minimized but room must be left for expansion of both the module and fixture during heating.

The dimensions (40 and 41) of ledge 36 are chosen so that the outer edges of the substrate itself can rest on the ledge, while the lower surface of the substrate is substantially over the hole.

The depth of the lower piece is discussed in the following paragraphs.

Figure 4A:
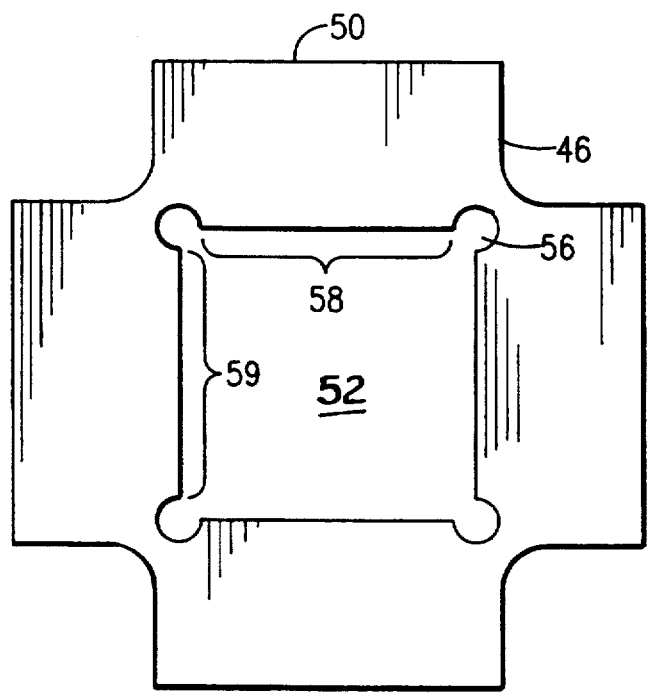
FIG. 4A is a top-view of the upper piece of the graphite lid seal fixture.
Figure 4B:
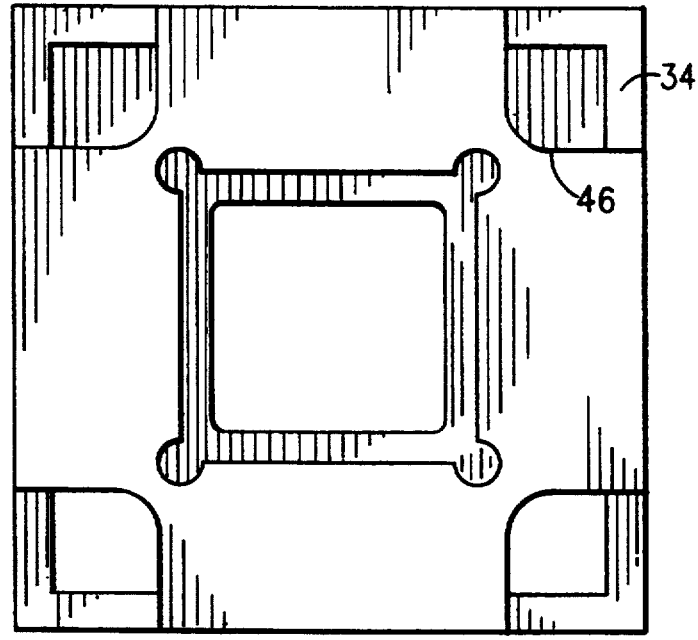
FIG. 4B is a top-view of the upper piece of the graphite lid in position on the lower piece.

The second, upper, piece of the graphic seal fixture is shown in FIG. 4A. Also made of graphite, the upper piece (50) is substantially rectangular and has a substantially rectangular hole (52) substantially in its center. The current embodiment has two additional features: four circular cutouts (56) were made on each of the corners of the rectangular hole for ease of machining. Further, notches (46) were cut out at each of the corners of the upper piece. Referring to FIG. 4B which is a diagram of the upper piece resting on the lower piece (shaded) without the module between, it can be seen that the notches of the upper piece (50) match the reverse notches in corners 34 of the lower piece of the fixture, so that the upper piece aligns to the lower piece by fitting inside the notched corners of the lower piece. It can be further seen that the hole within the upper piece is aligned so that its center is the same as the center of the hole in the lower piece of the fixture.

Referring back to FIG. 4A, the dimensions (58 and 59) of the hole (52) are chosen so that the lid of the module fits within the rectangular hole, securely enough to prohibit shifting laterally during heating but retaining enough room between the lid and the upper piece of the seal feature to allow for expansion during heating.

Figure 5:
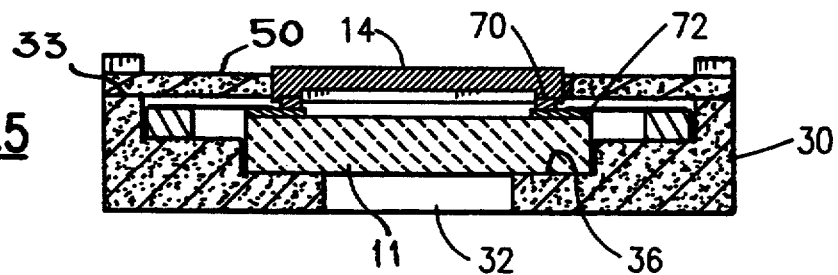
FIG. 5 is a cross-section of both parts of the graphite lid seal fixture with a lid and substrate in place for sealing.

When the graphite lid seal fixture is in use, the sealing process of the module proceeds as follows. The first step is that the substrate is inserted into the cavity of the lower part of the fixture, with the surface to be sealed uppermost. The upper piece of the fixture is then placed on top of the substrate and lead frame so that the notches on the upper piece of the fixture match the reverse notches on the lower piece of the fixture. The lid is then placed in the hole of the upper piece of the fixture so that the surface to be sealed to the substrate is facing down and in contact with the substrate at the sealband. Thus, as can be seen by referring to FIG. 5, a cross-section of the fixture with the module in place, the lower piece (30) of the graphite seal fixture is lower most. The substrate (11) rests on the ledges (36) of the cavity (32) on the lower piece 50. The upper piece of the graphite seal fixture rests on rim (33) of the lower piece. The lid (14) rests on the substrate with the solder (70) (which is already jointed to the lid) resting on the sealband (72) of the substrate. FIG. 5 illustrates the current embodiment in which the sealband area extends beyond the lid (14).

It should be noted that since the holes in the upper and lower pieces have the same center point when the upper piece is resting on the lower piece, that the fixture has the additional property of aligning the lid correctly on the substrate.

It should be noted that all the illustrations are representational and are not drawn to scale.

FIG. 5 illustrates how the depth dimensions of the fixture are chosen. For example, the depth of the ledge and floor of the lower piece are chosen so that the lead frame can rest on the floor and the edges of the substrate can rest on the ledge. The depth or thickness of the upper part is chosen, in the current embodiment to be substantially that of the lid. In practice, any thickness which provides sufficient material to retain heat and avoid undue fragility of the upper piece could be used.

Referring to FIG. 5, it will be noted that in the surface of the lid and substrate immediately adjacent to the sealband are substantially surrounded by the graphite walls of the holes in the upper and lower fixtures. (The corners of the module are adjacent to the cutouts in the upper and lower pieces of the fixture, hence these are an exception. However, small intrusions in the corners for VCOS modules are acceptable since there are no wire bonds at the corners.)

Once the modules is seated within the fixture, the fixture is heated. (In the present embodiment, the fixture is moved through a furnace on a conveyor belt.) The heating process is determined by the amount of heat necessary to melt the solder, keeping in mind the temperature restrictions mentioned previously. Accordingly, in the present embodiment, for VCOS modules, the fixture remains in the furnace 10 minutes using a bell profile with a peak temperature of 275° C.±5° Centigrade and a dwell above 240° C. of about 1.5 to 3 minutes.

When the module is heated within the graphite fixture, a more even heating and cooling of the solder occurs since the surrounding graphite provides solid heating which is more consistent than gaseous heating (gas may have hot spots). Further, it is theorized that the graphite retards the cooling process so that the interior of the module cools down more slowly, causing the interior pressure to drop more slowly.

Using the graphite lid seal fixture results in almost complete elimination of the solder intrusion problems. Using the current embodiment of the invention, in a six month test, 164 modules were fabricated and experienced only one side intrusion. That particular intrusion was, in addition, too small to constitute a production problem. In sum, as a result of using the fixture, there were 0 rejectable intrusions and only one part failed the heremeticity test for a fine leak, so that the overall yield of the process was 99.4%.

Alternate designs for the graphite lid seal fixture have also been devised. Clearly, the rectangular shape of the lower and/or upper pieces is useful, but not necessary. Similarly, the design of the fixture upper piece could be altered easily as long as the fixture surrounds the lid and the notches could be eliminated without substantially affecting the efficiency of the fixture.

The two piece design of the lid seal fixture was chosen since the leads from the module extend beyond its sides. This way, the module leads could be allowed to extend between the edges of the upper and lower pans of the fixture. In using the invention for other types of sealing, a one piece construction could be used. Thus, a graphite shell which would cover the side edges of an object to be solder sealed would also reduce solder intrusions.

Another option for the fixture is to use alternate materials. The present embodiment uses graphite: graphite does not warp a high temperatures, has good heat retaining properties and is easy to machine. Other materials with similar characteristics could also be used. Additional characteristics which are of importance in selecting the materials are fragility and the difference between their CTE (coefficient of thermal expansion) and that of the lid and substrate of the module.

The graphite lid seal fixture was first conceived as a method of keeping the lid and substrate aligned during the heating and cooling process. Graphite was used because of its easily machineable characteristics. In the use of the fixture, the unexpected benefit of reduced solder intrusions was discovered and the design of the fixture further refined to maximize this reduction.

The graphite fixture design eliminates intrusions along the interior edge of the module where they can cause yield problems. It also allows the solder to flow out the edge of the sealband creating visually "good" sealbands. Hermeticity yields are improved (approx 1%) and the process is more stable.

Another advantage is that the graphite fixture has minimal impact on existing processes. The same equipment used to heat modules is now used to heat the modules within the fixture. Hence, the fixture be used with the existing belt furnace and the same shape heating profile. In the current embodiment, the only change to the process was to lower the peak temperature by 5° C. A new process did not need to be qualified and no new tools were needed.

The almost complete elimination of intrusions also extends its benefits to module design. Once the possibility of intruding solder is eliminated, a chip design can be developed which uses all of the available space of the module or, conversely, the modules need not be designed with additional, unused space.

Although a specific embodiment of the invention (namely using the invention for sealing of packaged computer modules using solder sealing techniques) has been disclosed, it will be understood by those having skill in the art that changes can be made in the specific embodiment disclosed without departing from the spirit and scope of the invention. Thus, for example, this invention may be used in any sealing process in which two surfaces are sealed together by placing a third material between the surfaces on the areas to be bonded and subjecting that third materials to a condition which causes it to become more liquidus.

What is claimed is:

1. A fixture for use in solder sealing a cover including a first surface area to be sealed onto a substrate having at least one computer chip thereon and including a second surface area to be sealed, said fixture comprising:

a lower part of heat resistant material and including a plurality of upstanding sides defining an opening therebetween, said opening of said lower part being of a first traversed size adapted for having said substrate positioned therein in aligned orientation relative to said opening; and an upper part of heat resistant material positioned on said lower part and including a plurality of sides defining an opening therebetween, said opening of said upper part having a second transverse size smaller than said first transverse size adapted for having said cover positioned substantially therein, said first and second surface areas being aligned in a facing, contiguous orientation having a quantity of solder therebetween when said substrate is positioned within said opening of said lower part and said cover is positioned substantially within said opening of said upper part, said upper and lower parts substantially surrounding said facing and contiguous surface areas and said solder to assure an even distribution of heat to said solder to melt said solder when said fixture having said cover and substrate positioned therein is heated.

2. The fixture of claim 1 wherein said lower part includes a ledge therein substantially surrounding said opening located between said upstanding sides, said ledge adapted for having said substrate positioned thereon.

3. The fixture of claim 1 wherein said upstanding sides of said lower part includes a plurality of upstanding corner portions defining a corresponding plurality of recessed portions therebetween, said upper part including a plurality of notches formed therein, each of said notches aligning with a respective one of said upstanding corner portions when said upper part is positioned on said lower part.

4. The fixture of claim 1 wherein said heat resistant material of said upper and lower parts further assures a substantial even cooling of said solder following said heating and melting to thereby substantially prevent intrusion of said solder into said first and second surface areas during said cooling.

5. The fixture of claim 1 wherein said heat resistant material of both said upper and lower parts is comprised of graphite.

6. A method of solder sealing a cover including a first surface area to be sealed onto a substrate having at least one computer chip thereon and including a second surface area to be sealed, said method comprising:

forming a sealband on said substrate, said sealband defining said second surface area, said substrate including a plurality of edges adjacent said sealband;

positioning a quantity of solder on said cover relative to said first surface area, said cover including a plurality of edges adjacent said solder;

positioning said substrate within a lower part of a fixture wherein said lower part is comprised of heat resistant material and includes a plurality of upstanding sides defining an opening therebetween, said substrate being positioned within said lower part in aligned orientation relative to said opening between said upstanding side walls;

positioning said cover having said solder thereon onto said substrate positioned within said lower part of said fixture such that said first and second surface areas are located in a facing, contiguous orientation having said solder therebetween;

positioning an upper part of said fixture having a plurality of sides defining an opening therebetween and of a heat resistant material on said lower part of said fixture, said plurality of sides overlying said substrate such that said cover will be positioned by said sides relative to said substrate, said upper and lower parts substantially surrounding said facing and contiguous surface areas and said solder;

heating said fixture having said substrate and cover positioned therein, said upper and lower parts of said fixture assuring an even distribution of heat to said solder to cause said solder to melt; and thereafter allowing said fixture having said substrate and said cover positioned therein to cool.

7. The method of claim 6 wherein said upper and lower parts of said fixture assure substantially even cooling of said solder to thereby substantially prevent intrusions of said solder into said first and second surface areas during said cooling.

8. The method of claim 6 wherein said fixture is heated by placing said fixture on a belt and passing said fixture through a furnace.

9. The method of claim 6 wherein said fixture is heated to a peak temperature of about 275 degrees Centigrade.

* * * * *